(12) United States Patent
Sugawara et al.

(10) Patent No.: US 9,405,199 B2
(45) Date of Patent: Aug. 2, 2016

(54) METHOD FOR FORMING RESIST PATTERN

(71) Applicant: Tokyo Ohka Kogyo Co., Ltd., Kawasaki-shi (JP)

(72) Inventors: Mai Sugawara, Kawasaki (JP); Kiyoshi Ishikawa, Kawasaki (JP)

(73) Assignee: TOKYO OHKA KOGYO CO., LTD., Kawasaki-Shi (JP)

(*) Notice: Subject to any disclaimer, the term of this patent is extended or adjusted under 35 U.S.C. 154(b) by 0 days.

(21) Appl. No.: 14/450,536

(22) Filed: Aug. 4, 2014

(65) Prior Publication Data

US 2015/0044617 A1 Feb. 12, 2015

(30) Foreign Application Priority Data

Aug. 6, 2013 (JP) .................. 2013-163471

(51) Int. Cl.
*G03F 7/32* (2006.01)
*G03F 7/039* (2006.01)

(52) U.S. Cl.
CPC .............. *G03F 7/325* (2013.01); *G03F 7/0397* (2013.01)

(58) Field of Classification Search
CPC ........................................................ G03F 7/30
See application file for complete search history.

(56) References Cited

U.S. PATENT DOCUMENTS

| 2003/0073037 | A1* | 4/2003 | Rottstegge | ............... | G03F 7/32 430/311 |
|---|---|---|---|---|---|
| 2008/0187860 | A1 | 8/2008 | Tsubaki et al. | | |
| 2008/0261150 | A1 | 10/2008 | Tsubaki et al. | | |
| 2010/0323305 | A1 | 12/2010 | Tsubaki et al. | | |
| 2012/0058436 | A1 | 3/2012 | Tsubaki et al. | | |
| 2012/0315449 | A1 | 12/2012 | Tsubaki et al. | | |

FOREIGN PATENT DOCUMENTS

JP   2008-292975   12/2008

OTHER PUBLICATIONS https://en.wikipedia.org/wiki/1-Hexanol, retrieved on Sep. 25, 2015.*

* cited by examiner

*Primary Examiner* — Kathleen Duda
(74) *Attorney, Agent, or Firm* — Knobbe Martens Olson & Bear LLP

(57) ABSTRACT

A method of forming a resist pattern, and a film including a metal-containing compound formed on the resist pattern while developing the resist pattern. The method uses an organic solvent developer liquid, in which a metal compound capable of generating a hydroxyl group upon hydrolysis is dissolved in an organic solvent that does not have a functional group that reacts with the metal compound.

7 Claims, No Drawings

METHOD FOR FORMING RESIST PATTERN

CROSS-REFERENCE TO RELATED APPLICATIONS

This application claims priority to Japanese Patent Application No. 2013-163471, filed Aug. 6, 2013, the content of which is incorporated herein by reference.

BACKGROUND OF THE INVENTION

1. Field of the Invention

The present invention relates to an organic solvent developer liquid and a method for forming a resist pattern using the organic developer liquid.

2. Related Art

Methods for forming fine patterns by using resist have been used in the manufacture of various products. Particularly, further fining of resist patterns is requested in semiconductor elements, along with an enhancement of semiconductor performance, and thus, investigations are being conducted in various aspects.

As a method for forming such a fine resist pattern, there has been proposed a new negative type developing process which uses a combination of a positive type chemically amplified resist composition, that is a chemically amplified resist composition which acquires increased solubility in alkali developer liquids when exposed, and a developer liquid containing an organic solvent (a negative type developer liquid) (see, for example, Patent Document 1). A positive type chemically amplified resist composition acquires increased solubility in alkali developer liquids when exposed, but at this time, the solubility in organic solvents is relatively decreased. Therefore, in a negative type developing process, unexposed areas of a resist film are dissolved and removed by a negative type developer liquid that is an organic solvent developer liquid, and thus a resist pattern is formed. It is believed that such a method is advantageous in the formation of trench patterns or hole patterns as compared with conventional positive type developing processes.

[Patent Document 1] Japanese Unexamined Patent Application, Publication No. 2008-292975

SUMMARY OF THE INVENTION

For the resist pattern being formed by a negative type developing process as described in Patent Document 1, in order to respond to the demand for fining new future patterns, the improvements in various properties such as heat resistance and dry etching resistance are required so that various processing methods can be applied.

The present invention was achieved in view of such problems, and it is an object of the present invention to provide an organic solvent developer liquid capable of forming a resist pattern having excellent heat resistance and dry etching resistance, and to provide a method for forming a resist pattern which forms a film composed of a metal-containing compound on the resist pattern while developing the resist pattern using the organic solvent developer liquid.

A first aspect of the present invention is an organic solvent developer liquid, in which a metal compound (W) capable of generating a hydroxyl group upon hydrolysis is dissolved in an organic solvent (S), and the organic solvent (S) does not include a functional group that reacts with the metal compound (W).

A second aspect of the present invention is a method of forming a resist pattern that includes: forming a coating film by applying a photo resist composition on a substrate, site-selectively exposing the coating film, and forming a film composed of a metal-containing compound on the resist pattern while developing the resist pattern by dissolving a non-pattern part on the light exposed coating film in an organic solvent developer liquid;

wherein the organic solvent developer liquid includes a metal compound (W) capable of generating a hydroxyl group upon hydrolysis, which is dissolved in an organic solvent (S), and the organic solvent (S) does not have a functional group that reacts with the metal compound (W).

According to the present invention, an organic solvent developer liquid capable of forming a resist pattern having excellent heat resistance and dry etching resistance and a method for forming a resist pattern that forms a film composed of a metal-containing compound on the resist pattern while developing the resist pattern using the organic solvent developer liquid can be provided.

DETAILED DESCRIPTION OF THE PREFERRED EMBODIMENTS

Organic Solvent Developer Liquid

The organic solvent developer liquid according to the present invention includes a metal compound (W) capable of generating a hydroxyl group upon hydrolysis, which is dissolved in an organic solvent (S). The organic solvent (S) included in the organic solvent developer liquid does not include a functional group that reacts with the metal compound (W). Hereinafter, essential or any components included in the organic solvent developer liquid will be described in order.

[Metal Compound (W)]

An organic solvent developer liquid essentially includes a metal compound (W) (hereinafter, also referred to as a metal compound) capable of generating a hydroxyl group upon hydrolysis. By developing a resist pattern with the organic solvent developer liquid including such a metal compound (W), the metal compound (W) on the surface of the resist pattern is hydrolyzed with the moisture in the atmosphere to generate the metal compound having a hydroxyl group. Subsequently, by generating a dehydration-condensation between the metal compounds having the hydroxyl groups, a thin film of a metal oxide including the same metal as the metal atom included in the metal compound (W) is formed on the surface of the resist pattern.

The metal atom included in the metal compound (W) is not particularly limited within the range that the purpose of the present invention is not negatively affected. Examples of the metal atom included in the metal compound (W) may include titanium, zirconium, aluminum, niobium, silicon, boron, lanthanide, yttrium, barium, cobalt, iron, zirconium, tantalum, and the like. Among these metal atoms, titanium and silicon are preferable, and silicon is more preferable.

The number of the metal atoms included in the metal compound (W) may be either one, or two or more although one atom is preferable. In the case where the metal compound (W) includes a plurality of metal atoms, the plurality of metal atoms may be of the same kind or different kinds.

For the metal compound (W), it is preferable that the functional group (hereinafter, also referred to as a hydrolysable group) capable of generating a hydroxyl group upon hydrolysis be directly bound to a metal atom.

The number of the hydrolysable groups included in the metal compound (W) is preferably two or more, more preferably 2 to 4, and still more preferably 4 with respect to one metal atom. In the case where the metal compound (W) includes two or more of the hydrolysable groups, by the condensation reaction between hydroxyl groups generated by hydrolysis, it is easy to form a strong coating film composed of condensates of the metal compounds (W).

Examples of preferred hydrolysable groups may include an alkoxy group, an isocyanate group, a dimethyl amino group, a halogen atom, and the like. Linear or branched aliphatic alkoxy groups having 1 to 5 carbon atoms are preferable as the alkoxy groups. Specific examples of the preferred alkoxy groups may include a methoxy group, an ethoxy group, an n-propoxy group, an isopropoxy group, an n-butoxy group, and the like. A chlorine atom, a fluorine atom, a bromine atom and an iodine atom are preferable as the halogen atoms, but a chlorine atom is more preferable.

Among the hydrolysable groups described above, the isocyanate group is preferable because it is easily hydrolyzed and easily forms a film on the surface of the resist pattern by the reactions between the metal compounds (W).

For the metal compound (W), along with the hydrolysable group, a hydrogen atom or an organic group may be bound to a metal atom. As an organic group, linear or branched alkyl groups having 1 to 5 carbon atoms are preferable. Specific examples of the alkyl group having 1 to 5 carbon atoms may include a methyl group, an ethyl group, an n-propyl group, an isopropyl group, an n-butyl group, a sec-butyl group, a tert-butyl group, an n-pentyl group, an isopentyl group, a sec-pentyl group, and a tert-pentyl group.

In addition, metal carbonyl, that is a metal complex having carbon monoxide as a ligand, may be also an example of the metal compound (W). Examples of the metal carbonyl may include pentacarbonyl iron $(Fe(CO)_5)$ or a polynuclear cluster thereof.

Hereinafter, preferred examples of the metal compound (W) will be described. Preferred examples of the metal compound (W) may be a compound represented by the following General Formula (1).

$$R_{m-n}MX_n \quad (1)$$

(in the above Formula (1), M represents a metal atom selected from the group consisting of titanium, zirconium, aluminum, niobium, silicon, boron, lanthanide, yttrium, barium, cobalt, iron, zirconium, and tantalum, R represents a linear or branched alkyl group having 1 to 5 carbon atoms, X represents a group selected from the group consisting of a linear or branched alkoxy group having 1 to 5 carbon atoms, an isocyanate group, and a halogen atom, m represents the atomic value of the metal atom M, and n represents an integer of 2 or more and m or less.)

In General Formula (1), in the case where X represents a linear or branched alkoxy group having 1 to 5 carbon atoms, specific examples of the metal compound (W) may include a metal alkoxide of rare earth metals such as titanium tetra-n-butoxide, zirconium tetra-n-propoxide, aluminum tri-n-butoxide, niobium penta-n-butoxide, tetramethoxysilane, methyl trimethoxy silane, dimethyl dimethoxy silane, ethyl trimethoxy silane, diethyl dimethoxy silane, methyl triethoxy silane, dimethyl diethoxy silane, ethyl triethoxy silane, diethyl diethoxy silane, and boron triethoxide; and a metal alkoxide of rare earth metals such as lanthanide triisopropoxide and yttrium triisopropoxide.

A hydrolyzed condensate of the metal compound (W) described above having two or more alkoxy groups also can be used as the metal compound (W) as long as the hydrolyzed condensate has one or more alkoxy groups.

In General Formula (1), in the case where X represents an isocyanate group, specific examples of the metal compound (W) may include tetraisocyanate silane, titanium tetraisocyanate, zirconium tetraisocyanate, aluminum triisocyanate, and the like.

In General Formula (1), in the case where X represents a halogen atom, X is preferably a chlorine atom, a fluorine atom, a bromine atom, and an iodine atom, and more preferably, a chlorine atom. In General Formula (1), in the case where X represents a halogen atom, specific examples of the metal compound (W) may include tetrachlorotitanium, tetrachlorosilane, methyltrichlorosilane, dimethyldichlorosilane, ethyltrichlorosilane, diethyl dichlorosilane, cobalt chloride (II), and the like.

Among them, a silicon compound represented by the following General Formula (2) is preferable because it has high activity for hydrolysis, especially, and can easily form a film composed of a condensate of the metal compound (W) without performing a heat treatment on the surface of a resist pattern.

$$R_{4-n}SiX_n \quad (2)$$

In Formula (2), R represents a linear or branched alkyl group having 1 to 5 carbon atoms, X represents a group selected from the group consisting of an isocyanate group and a halogen atom, and n represents an integer of 2 or more and 4 or less. In General Formula (2), X preferably represents an isocyanate group and n preferably represents 4.

The metal compounds (W) described above may be used singly or in a combination of two or more kinds thereof.

A concentration of the metal compound (W) in an organic solvent developer liquid is not particularly limited if it is within the range that enables the preparation of an organic solvent developer liquid, which is homogenously dissolved. The concentration of the metal compound (W) in the organic solvent developer liquid is preferably 1 to 200 mmol/L, more preferably 5 to 150 mmol/L, and still more preferably 5 to 100 mmol/L.

[Organic Solvent (S)]

An organic solvent (S) included in an organic solvent developer liquid is not particularly limited if it is an organic solvent that is conventionally used for developing a resist pattern, and it does not include a functional group that reacts with the metal compound (W). The functional group that reacts with the metal compound (W) includes both of a functional group that directly reacts with a group capable of generating a hydroxyl group by hydrolysis and a functional group that reacts with a hydroxyl group generated by hydrolysis. Examples of the functional group that reacts with the metal compound (W) may include a group having a carbon-carbon double bond, such as a vinyl group, a hydroxyl group, a carboxyl group, an amino group, a halogen atom, and the like.

If the organic solvent (S) does not have the functional groups described above, the metal compound (W) can be stably present in the organic solvent developer liquid. Therefore, in the case of using the organic solvent developer liquid according to the present invention, a reduction of the content of the metal compound (W) is prevented during the storage of the organic solvent developer liquid or the generation of fine particles is prevented that are condensates of the metal compound (W) generated as a result of the reaction of the metal compound (W) and the organic solvent (S) in the organic solvent developer liquid.

For this reason, when a resist pattern is developed by using the organic solvent developer liquid according to the present invention, the surface of the resist pattern is not contaminated with fine particles, and can be coated with a film composed of a metal-containing compound generated by a hydrolysis condensation of the metal compound (W).

Preferred examples of the organic solvent (S) may include a polar solvent such as a ketone-based solvent, an ester-based solvent, an ether-based solvent, and an amide-based solvent, and a hydrocarbon-based solvent.

The ketone-based solvent is an organic solvent including C—C(=O)—C in the structure thereof. The ester-based solvent is an organic solvent including C—C(=O)—O—C in the structure thereof. The ether-based solvent is an organic solvent including C—O—C in the structure thereof. As the organic solvents, there are organic solvents including various kinds of the functional groups that are characteristic of the above respective solvents in the structures, but in these cases, they seem to correspond to any kinds of the solvents including the functional groups included in the organic solvents. The hydrocarbon-based solvent is composed of hydrocarbon, and is a hydrocarbon-based solvent without a substituent (a group or atom other than a hydrogen atom and hydrocarbon group).

As specific examples of each of the solvents, examples of the ketone-based solvent may include 1-octanone, 2-octanone, 1-nonanone, 2-nonanone, acetone, 2-heptanone, 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, γ-butyrolactone, and the like.

Examples of the ester-based solvent may include, as a chain ester-based solvent, methyl acetate, butyl acetate, ethyl acetate, isopropyl acetate, pentyl acetate, isopentyl acetate, methoxyethyl acetate, ethoxyethyl acetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxy butyl acetate, 3-methoxy butyl acetate, 4-methoxy butyl acetate, 3-methyl-3-methoxy butyl acetate, 3-ethyl-3-methoxy butyl acetate, propylene glycol monomethyl ether acetate, propylene glycol monoethyl ether acetate, propylene glycol monopropyl ether acetate, 2-ethoxy butyl acetate, 4-ethoxy butyl acetate, 4-propoxy butyl acetate, 2-methoxy pentyl acetate, 3-methoxy pentyl acetate, 4-methoxy pentyl acetate, 2-methyl-3-methoxy pentyl acetate, 3-methyl-3-methoxy pentyl acetate, 3-methyl-4-methoxy pentyl acetate, 4-methyl-4-methoxy pentyl acetate, propylene glycol diacetate, methyl formate, ethyl formate, butyl formate, propyl formate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl-3-methoxypropionate, ethyl-3-methoxypropionate, ethyl-3-ethoxypropionate, propyl-3-methoxypropionate, and the like. In addition, examples of a cyclic ester-based solvent may include lactones such as γ-butyrolactone, and the like.

Examples of the ether-based solvent may include glycol ether-based solvents such as ethylene glycol dibutyl ether, propylene glycol dimethyl ether, propylene glycol diethyl ether, diethylene glycol dimethyl ether, diethylene glycol diethyl ether, and diethylene glycol dibutyl ether; diisopentyl ether, diisobutyl ether, dioxane, tetrahydrofuran, anisole, perfluoro-2-butyl tetrahydrofuran, perfluoro tetrahydrofuran, 1,4-dioxane, and the like. Among them, the glycol ether-based solvent is preferable.

Examples of the amide-based solvent may include N-methyl-2-pyrrolidone, N,N-dimethyl acetamide, N,N-dimethylformamide, hexamethylphosphoric triamide, 1,3-dimethyl-2-imidazolidinone, and the like.

As other polar solvent, dimethylsulfoxide is also preferably used as an organic solvent (S).

Examples of the hydrocarbon-based solvent may include aliphatic hydrocarbon-based solvents such as pentane, hexane, octane, decane, 2,2,4-trimethyl pentane, 2,2,3-trimethyl hexane, perfluorohexane, perfluoroheptane, limonene and pinene; and aromatic hydrocarbon-based solvents such as toluene, xylene, ethyl benzene, propyl benzene, 1-methylpropyl benzene, 2-methylpropyl benzene, dimethyl benzene, diethyl benzene, ethylmethyl benzene, trimethyl benzene, ethyldimethyl benzene, and dipropyl benzene. Among them, the aromatic hydrocarbon-based solvent is preferable.

For the organic solvent (S) described above, a value of log P that is the octanol/water distribution coefficient is preferably 3.5 or less. In this case, the hydrolysis of the metal compound (W) in the organic solvent developer liquid and thereby the generation of fine particles by the hydrolysis condensation of the metal compound (W) are easily suppressed.

The value of log P of the organic solvent (S) can be calculated by the calculation using the parameters of Ghose, Pritchett, Crippen, et al. (see J. Comp. Chem., 9, 80 (1998)). Such a calculation may be performed by using software such as CAChe 6.1 (manufactured by FUJITSU Ltd.)

Preferred examples of the solvent having a value of log P of 3.5 or less may include hydrocarbon-based solvents such as toluene, xylene, 1,2,4-trimethylbenzene, limonene and pinene; ester-based solvents such as butyl acetate, propylene glycol monomethyl ether acetate, diethylene glycol monobutyl ether acetate, and γ-butyrolactone; ether-based solvents such as diisopentyl ether, dibutyl ether, diethylene glycol dibutyl ether and ethylene glycol dibutyl ether; dimethyl sulfoxide; amide-based solvents such as N-methyl-2-pyrrolidone; and ketone-based solvents such as 2-octanone, acetyl acetone and cyclohexanone.

A solvent including one or more hetero atoms selected from N, O, S, and P is preferable as the organic solvent (S). The solvent having the above-described structure has high polarity in some degree caused by including the above-described hetero atoms. For this reason, when developing a resist pattern, the organic solvent (S) including the above hetero atoms can favorably dissolve a non-exposed part of the coating film composed of a photo resist composition and can easily suppress the hydrolysis of the metal compound (W). It is believed that in the above organic solvents (S), since the water molecules are rapidly distributed in the organic solvents (S) and the water molecules and the molecules of the organic solvent (S) exhibit high affinity, thereby the probability that the molecule of the metal compound (W) comes into contact with the water molecule is decreased, the hydrolysis speed of the metal compound (W) is delayed.

Among the above-described organic solvents (S), from the viewpoint of the value of log P and chemical structure, favorable solubility of the metal compound (W), and a developing property of the obtained organic solvent developer liquid, an ester-based solvent is preferable, ester acetate such as methyl acetate, butyl acetate, ethyl acetate, isopropyl acetate, pentyl acetate, and isopentyl acetate is more preferable, and butyl acetate is still more preferable.

The organic solvents (S) may be used singly or in a combination of two or more kinds thereof.

The content of the organic solvent (S) in the organic solvent developer liquid is generally the residual amount for the total amount of the content of the metal compound (W) and the contents of the other components to be described below.

[Other Components]

In the organic solvent developer liquid, a known additive may be added, if necessary. Examples of the additive include a surface active agent. The surface active agent is not specifically limited, and examples thereof that can be used include an ionic or non-ionic fluorine and/or silicon surface active agent.

Examples of the commercially available surface active agent that can be used include a fluorine surface active agent or a silicon surface active agent including EFTOP EF301 and EF303 (trade names, manufactured by SHINAKITA KASEI), FLORADO FC430 and 431 (trade names, manufactured by Sumitomo 3M Limited), MEGAFAC F171, F173, F176, F189, and R08 (trade names, manufactured by DIC Corporation), SURFLON S-382, SC101, 102, 103, 104, 105, and 106 (trade names, manufactured by ASAHI GLASS CO., LTD.), and TROYSOL S-366 (trade names, manufactured by Troy Chemical Co.). Further, the polysiloxane polymer KP-341 (trade name, manufactured by Shin-Etsu Chemical Co., Ltd.) can be also used as a silicon surface active agent.

Further, as a surface active agent, a surface active agent in which a polymer having a fluoroaliphatic group that is derived from a fluoroaliphatic compound produced by telomerization method (also referred to as telomer method) or oligomerization method (also referred to as oligomer method) may be also used in addition to those well known in the field as described above.

Preferred examples of the polymer having a fluoroaliphatic group include a copolymer of a monomer having a fluoroaliphatic group and (poly(oxyalkylene))acrylate and/or (poly(oxyalkylene))methacrylate, and it may have a random distribution or block copolymerization. Further, examples of the poly(oxyalkylene) group include poly(oxyethylene) group, a poly(oxypropylene) group, and a poly(oxybutylene) group. It may be also a unit with alkylene having different chain length in a chain with the same chain length like poly(block conjugate of oxyethylene and oxypropylene and oxyethylene) or poly(block conjugate of oxyethylene and oxypropylene) group. Further, copolymer of a monomer having a fluoroaliphatic group and (poly(oxyalkylene))acrylate (or methacrylate) may be a ternary or higher copolymer which is obtained by simultaneous copolymerization of two or more different types of a monomer having a fluoroaliphatic group or two or more different types of (poly(oxyalkylene))acrylate (or methacrylate) as well as a binary copolymer.

Examples of the commercially available surface active agent include MEGAFAC F178, F-470, F-473, F-475, F-476, and F-472 (trade names, manufactured by DIC Corporation). Further examples include a copolymer of acrylate (or methacrylate) having a $C_6F_{13}$ group and (poly(oxyalkylene))acrylate (or methacrylate), a copolymer of acrylate (or methacrylate) having a $C_6F_{13}$ group and (poly(oxyethylene))acrylate (or methacrylate) and (poly(oxypropylene))acrylate (or methacrylate), a copolymer of acrylate (or methacrylate) having a $C_8F_{17}$ group and (poly(oxyalkylene))acrylate (or methacrylate), a copolymer of acrylate (or methacrylate) having a $C_8F_{17}$ group and (poly(oxyethylene))acrylate (or methacrylate) and (poly(oxypropylene))acrylate (or methacrylate).

As for the surface agent, a non-ionic surface active agent is preferable. A fluorine-based surface active agent or a silicon surface active agent is more preferable.

In the case where the surface active agent is added, the addition amount is typically 0.001 to 5% by mass, preferably 0.005 to 2% by mass, and more preferably 0.01 to 0.5% by mass per the total mass of the organic solvent developer liquid.

<<Method for Forming Resist Pattern>>

Using the organic solvent developer liquid described above, a resist pattern is formed according to the following method.

In detail, the resist pattern is formed by the method including:

forming a coating film by applying a photo resist composition on a substrate, site-selectively exposing the coating film, and forming a film composed of a metal-containing compound on the resist pattern while developing the resist pattern by dissolving a non-pattern part on the light exposed coating film in the organic solvent developer liquid.

The photo resist composition used for forming a coating film is not particularly limited as long as it is used for so-called "negative type developing" using an organic solvent developer liquid. Preferred examples of the photo resist composition used for negative type developing may include the photo resist composition including (A) a resin having solubility, in an organic solvent developer liquid, that decreases according to the action of an acid, (B) a compound which generates an acid when irradiated with actinic light or radiation, and (C) an organic solvent. The above photo resist composition is disclosed in the above-described Patent Document 1, for example.

Examples of (A) the resin having solubility, in an organic solvent developer liquid, that decreases according to the action of an acid, may include the resin having the group (hereinafter, also referred to as an "acid decomposable group") that generates an alkali soluble group, in which the main chain or side chain of the resin or both of the main chain and the side chain of the resin are decomposed by the action of an acid. Examples of the alkali soluble group may include a phenolic hydroxyl group, a carboxylic acid group, a fluorinated alcohol group, a sulfonic acid group, sulfone amide group, a sulfonyl imide group, a (alkylsulfonyl) (alkylcarbonyl) methylene group, a (alkylsulfonyl) (alkylcarbonyl) imide group, a bis(alkylcarbonyl) methylene group, a bis(alkylcarbonyl) imide group, a bis(alkylsulfonyl) methyl group, a bis(alkylsulfonyl) imide group, a tris(alkylcarbonyl) methylene group and a tris(alkylsulfonyl) methylene group, and a carboxylic acid group, a fluorinated alcohol group (preferably hexafluoroisopropanol) and a sulfonic acid group are preferable.

For the acid decomposable group, an acid dissociable group detached from an alkali soluble group according to the action of an acid may be properly selected from the groups that have been proposed as an acid dissociable group for the resin for a chemical amplified resist. Generally, the groups forming an alkali soluble group such as a carboxyl group and cyclic or chain-like tertiary alkyl ester for (meth)acrylic acid or an acetal acid dissociable group such as an alkoxy alkyl group are widely known.

The compound (B) that generates acid by the irradiation of actinic rays or radiation is not particularly limited, and various compounds that are conventionally used for a photo resist composition can be used. Specific examples of the compounds may include diazonium salt, phosphonium salt, sulfonium salt, iodonium salt, imide sulfonate, oxime sulfonate, diazo disulfone, disulfone, and o-nitro benzyl sulfonate.

The photo resist composition including the above-described components is applied onto the surface of a substrate to form a coating film on the substrate. A method for applying the photo resist composition on the substrate is not particularly limited if the photo resist composition can be favorably applied onto the substrate to be a desired thickness of the film. Specific examples of the applying method may include a spin coating method, a spraying method, a roller coating method, and a dipping method, and the spin coating method is more preferable.

The photo resist composition is applied onto the substrate to form a coating film, and then, if necessary, the coating film on the substrate may be heated (pre-baking). In this way, the film, from which the unnecessary solvent is removed, can be uniformly formed. The temperature of the pre-baking is not particularly limited, but it is preferably 50° C. to 160° C., and more preferably 60° C. to 140° C.

The kind of the substrate used for forming the coating film is not particularly limited. Examples of the substrate may include an inorganic substrate like silicon, $SiO_2$, and SiN and a coated inorganic substrate like SOG, that are generally used for a process for fabricating semiconductors like IC, a process for fabricating a circuit substrate like thermal head, and liquid crystal, and also a lithography process for other photoapplications.

It is also possible to coat and form an anti-reflective film on the substrate before forming the coating film. As an anti-reflective film, both an inorganic film type like titanium, titanium dioxide, titanium nitride, chrome oxide, carbon, and amorphous silicon, and an organic film type consisting of a light absorbing agent and a polymer material can be used. Further, as an organic anti-reflective film, commercially available organic anti-reflective films like DUV-30 series or DUV-40 series manufactured by Brewer Science, Inc. and AR-2, AR-3, and AR-5 manufactured by Shipley can also be used.

Subsequently, the formed coating film is site-selectively exposed with active energy rays such as ultraviolet rays or electron beam so as to have the desired pattern. The light exposure method is not particularly limited, but various methods that are conventionally known may be properly selected. Examples of the preferred method may include a method of irradiating active energy rays such as ultraviolet rays or electron beam through a predetermined mask on a coating film.

By the light exposure described above, a light exposed part and a non-exposed part are formed on the coating film. In addition, the solubility of the coating film in the organic solvent developer liquid is decreased according to the generation of acid by the light exposure on the light exposed part of the coating film composed of the above-described photo resist composition. Meanwhile, since the non-exposed part is not irradiated with the active energy rays, it is in a state easily dissolved in the developer liquid containing the organic solvent.

Examples of the active energy rays may include infrared light, visible light, ultraviolet light, far-ultraviolet light, X-rays, and electron beam. Of these, far-ultraviolet light having a wavelength of 250 nm or less, preferably 220 nm or less, and more preferably 1 to 200 nm is preferable. Specific examples of far-ultraviolet light may include ArF excimer laser, $F_2$ excimer laser, EUV (13 nm), and the like.

In the light exposure process, if necessary, a liquid immersion exposure method that performs the light exposure by filling a liquid immersion medium between an optical lens part and a resist film may be applied. The liquid immersion medium is not particularly limited as long as it is a liquid having a refractive index higher than that of air and also having lower than that of the coating film to be used. Examples of the above liquid immersion medium may include water (pure water, de-ionized water), the liquid having high refractive index by adding various additives to water, fluorine-based inert liquid, silicon-based inert liquid, hydrocarbon-based liquid, and the like, but the liquid immersion medium having the property of a high refractive index, which is expected to be developed in the near future, can be also used. Examples of the fluorine-based inert liquid may include a liquid having a fluorine-based compound such as $C_3HCl_2F_5$, $C_4F_9OCH_3$, $C_4F_9OC_2H_5$, and $C_5H_3F_7$, as a main component. Among them, from the viewpoint of costs, safety, environmental concerns, and universal usability or the like, in the case of using exposure light (ArF excimer laser, and the like) having a wavelength of 193 nm, water (pure water, de-ionized water) is preferable, and in the case of using exposure light ($F_2$ excimer laser, and the like) having a wavelength of 157 nm, the fluorine-based inert solvent is preferable.

After completing the light exposure, the baking (PEB) is preferably performed. The temperature of the PEB is not particularly limited if the favorable resist pattern is obtained, but generally it is from 40° C. to 160° C.

Following light exposure, the developing of the resist pattern is performed by bringing the light exposed coating film into contact with the above-described organic solvent developer liquid. When the resist pattern is developed, while the non-pattern part corresponding to the non-exposed part in the light exposed coating film is dissolved in the above-described organic solvent developer liquid, the film composed of a metal-containing compound generated by the hydrolysis condensation of the metal compound (W) capable of generating a hydroxyl group upon hydrolysis included in the above-described organic solvent developer liquid is formed on the surface of the resist pattern to be formed.

According to the above-described method for forming a resist pattern, the surface of the resist pattern is favorably coated with the film composed of a metal-containing compound, for example, silica ($SiO_2$), so that even if the resist pattern is heated, the resist pattern, in which the change of shape thereof is difficult to generate, can be formed. In addition, the resist pattern having the film composed of the metal-containing compound as described above has excellent dry etching resistance.

The method for developing the resist pattern by using the organic solvent developer liquid is not specifically limited, and it may be carried out after appropriately selected from known developing methods. Preferred developing methods include a method of dipping the substrate having the light exposed coating film in the organic solvent developer liquid for a certain period of time (dipping method), a method of accumulating the organic solvent developer liquid on a surface of the light exposed coating film by taking advantage of surface tension and keeping it for a certain period of time (paddle method), a method of spraying the organic solvent developer liquid on a surface of the light exposed coating film (spray method), and a method of applying continuously the organic solvent developer liquid to the substrate rotating at a constant speed while scanning a nozzle for applying the organic solvent developer liquid at a constant speed to the light exposed coating film (dynamic dispenser method).

Further, after the developing step, it is also possible to carry out a step of terminating the development while the organic solvent developer liquid is replaced with other solvent.

After the developing step, the resist pattern may be cleaned with a rinse liquid containing an organic solvent.

The rinse liquid used for the rinsing step is not specifically limited if it does not dissolve the resist pattern, and a solution containing a common organic solvent may be used. Examples of the organic solvent which is usable as a rinse liquid are the same as the organic solvent that may be contained in the organic solvent developer liquid. The rinse liquid may contain plural organic solvents and also contain an additional organic solvent other than those described above.

To the rinse liquid, an appropriate amount of a surface active agent may be added, and used.

After developing or after rinsing, if necessary, it is preferable to dry the substrate having the resist pattern by using a known method.

EXAMPLES

Herein below, the present invention is explained in greater detail in view of the Examples, but it is evident that the present invention is not limited to the Examples.

Herein below, the components contained in the resist composition that is used in the Examples are explained.

(A) Resin Having Solubility in an Organic Solvent Developer Liquid, that Decreases According to the Action of an Acid As for the component (A) contained in the resist composition, a resin composed of the following constituent units was used. The number described in each constituent unit represents mol % of each constituent unit per total constituent units contained in the resin. Further, the weight average molecular weight of the resin composed of the following constituent units was 7000 and the dispersity of the resin was 1.66.

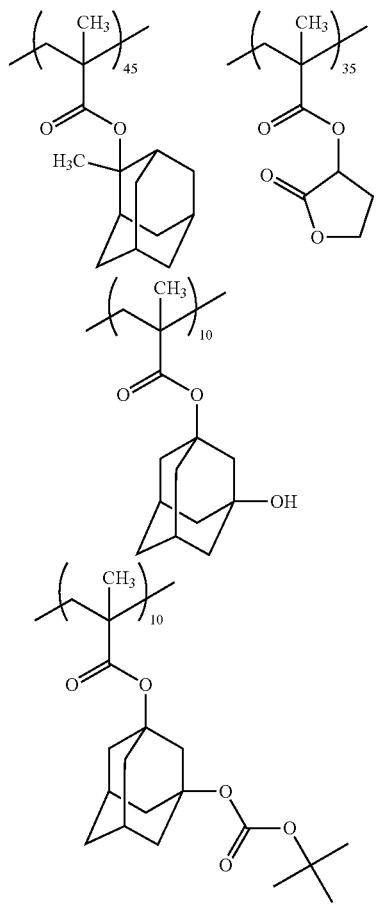

(B) Photo-Acid Generator Component

As for the photo-acid generator which is included as the component (B) in the resist composition, the compound with the following formula was used.

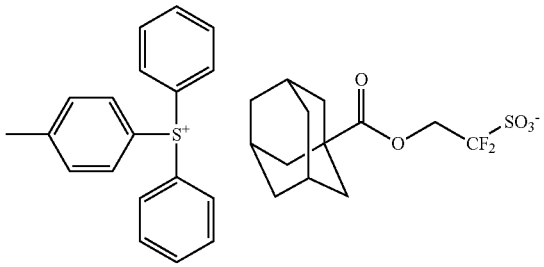

(C) Solvent

As for the solvent which is included as the component (C) in the resist composition, a mixture solvent of propylene glycol monomethyl ether acetate (PGMEA) and cyclohexanone (CH) in which content of PGMEA is 90% by mass and content of CH is 10% by mass was used.

(D) Quencher

As for the quencher which is included as the component (D) in the resist composition, the compound with the following formula was used.

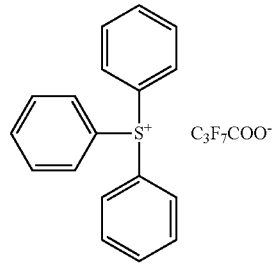

(E) Organic Carboxylic Acid

As for the organic carboxylic acid which is included as the component (E) in the resist composition, salicylic acid was used.

(F) Fluorine Containing Compound

As for the fluorine containing compound which is the component (F) contained in the resist composition, a resin composed of the following constituent units was used. The number described in each constituent unit represents mol % of each constituent unit per total constituent units contained in the resin. Further, the weight average molecular weight of the resin composed of the following constituent units was 23000 and the dispersity of the resin was 1.30.

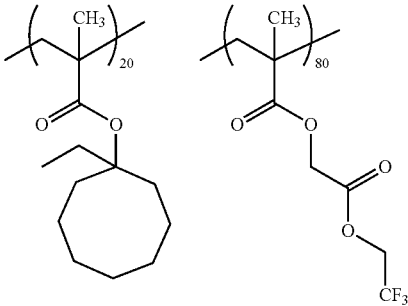

Further, as a component other than those described above, gamma butyrolactone was added to the resist composition.

Composition of each component in the resist composition used for the Examples is shown in the following Table 1.

TABLE 1

| Component | Amount used (Parts by mass) |
| --- | --- |
| Component (A) | 100 |
| Component (B) | 5 |
| Component (C) | 2580 |
| Component (D) | 3.5 |
| Component (E) | 0.1 |
| Component (F) | 4 |
| Gamma butyrolactone | 100 |

Example 1

The above photo resist composition was applied, by a spinner, on the silicon wafer with an anti-reflective film having a film thickness of 82 nm "ARC29A (manufactured by Brewer Science Inc.)" and then was subjected to baking at 105° C. for 60 seconds to form a photo resist film having a film thickness of 100 nm. After this, the obtained photo resist film was exposed by using light exposure equipment (Trade Name, "NSR-S302A", manufactured by Nikon Corporation) in a predetermined pattern through a mask having a space width of 130 nm and a pitch width of 260 nm and heated at 95° C. for 60 seconds.

After light exposure, developing was performed at 23° C. for 60 seconds by using an organic solvent developer liquid prepared by dissolving $Si(NCO)_4$ in n-butyl acetate to be at a concentration of 10 mmol/L. After developing, the developer liquid was dried to form a line and space pattern having a space width of 130 nm and a pitch width of 260 nm. The value of log P of the n-butyl acetate was 1.071.

The obtained line and space pattern was baked at 200° C. for 60 seconds. Before and after the baking, the line and space pattern was observed by using a scanning electron microscope. As a result, it was confirmed that the cross-sectional shapes of the line and space patterns before and after the baking were a favorable rectangle, and there was almost no change in the shapes of the line and space patterns before and after the baking.

Comparative Example 1

A line and space pattern was obtained in the same method as Example 1, except that n-butyl acetate without $Si(NCO)_4$ was used as the developer liquid. The obtained line and space pattern was baked at 200° C. for 60 seconds. Before the baking, the line and space pattern was observed by using a scanning electron microscope. As a result, it was confirmed that the shape of the line and space pattern was identical with the shapes of the line and space pattern before the baking obtained in Example 1. Meanwhile, after baking, the line and space pattern was observed by using a scanning electron microscope. As a result, it was confirmed that the line and space pattern was not maintained in a rectangular shape by generating a power-down through overheating caused by a heat change of the line and space pattern.

As seen from the above contents, it can be confirmed that by using the organic solvent developer liquid prepared by dissolving the metal compound (W) capable of generating a hydroxyl group upon hydrolysis in an organic solvent (S), in which the organic solvent (S) does not have a functional group that reacts with the metal compound (W), a resist pattern having excellent heat resistance and dry etching resistance, in which the pattern is favorably coated with a film composed of the metal compound such as silica ($SiO_2$), can be formed.

What is claimed is:

1. A method for forming a resist pattern, the method comprising:
   forming a coating film by applying, on a substrate, a photo resist composition;
   site-selectively exposing the coating film; and
   forming a film composed of a metal-containing compound on the resist pattern while developing the resist pattern by dissolving a non-pattern part in the light exposed coating film in an organic solvent developer liquid;
   wherein the organic solvent developer liquid includes a metal compound (W) capable of generating a hydroxyl group upon hydrolysis, which is dissolved in an organic solvent (S), the organic solvent (S) does not have a functional group that reacts with the metal compound (W), and the organic solvent (S) is an ester acetate.

2. The method for forming the resist pattern according to claim 1, wherein the metal compound (W) is a silicon compound having two or more of isocyanate groups bound to a silicon atom.

3. The method for forming the resist pattern according to claim 1, wherein a value of Log P of the organic solvent (S) is 3.5 or less.

4. The method for forming the resist pattern according to claim 1, wherein the organic solvent (S) includes one or more hetero atoms selected from N, O, S, and P.

5. The method for forming the resist pattern according to claim 1, wherein the organic solvent (S) is butyl acetate.

6. The method for forming the resist pattern according to claim 1, wherein the metal compound (W) is represented by the following General Formula (1):

$$R_{m-n}MX_n \qquad (1)$$

wherein M represents a metal atom selected from the group consisting of titan, zirconium, aluminum, niobium, silicon, boron, lanthanide, yttrium, barium, cobalt, iron, zirconium, and tantalum, R represents a linear or branched alkyl group having 1 to 5 carbon atoms, X represents a group selected from the group consisting of a linear or branched alkoxy group having 1 to 5 carbon atoms, an isocyanate group, and a halogen atom, m represents the atomic value of the metal atom M, and n represents an integer of 2 or more and m or less.

7. The method for forming the resist pattern according to claim 1, wherein the metal compound (W) is represented by the following General Formula (2):

$$R_{4-n}SiX_n \qquad (2)$$

wherein R represents a linear or branched alkyl group having 1 to 5 carbon atoms, X represents a group selected from the group consisting of an isocyanate group and a halogen atom, and n represents an integer of 2 or more and 4 or less.

* * * * *